(12) United States Patent
Pakalapati et al.

(10) Patent No.: US 10,174,438 B2
(45) Date of Patent: *Jan. 8, 2019

(54) APPARATUS FOR HIGH PRESSURE REACTION

(71) Applicant: SLT TECHNOLOGIES, INC., Los Angeles, CA (US)

(72) Inventors: Rajeev Tirumala Pakalapati, Santa Barbara, CA (US); Mark P. D'Evelyn, Santa Barbara, CA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,806

(22) Filed: Mar. 30, 2017

(65) Prior Publication Data

US 2018/0282897 A1    Oct. 4, 2018

(51) Int. Cl.
  C30B 7/14    (2006.01)
  C30B 7/10    (2006.01)
  C30B 29/40   (2006.01)

(52) U.S. Cl.
  CPC .............. C30B 7/105 (2013.01); C30B 7/14 (2013.01); C30B 29/406 (2013.01)

(58) Field of Classification Search
  CPC .................. C30B 7/10; C30B 7/105
  See application file for complete search history.

(56) References Cited

U.S. PATENT DOCUMENTS

| | | |
|---|---|---|
| 2,979,413 A | 4/1961 | Ballman et al. |
| 4,019,950 A | 4/1977 | Croxall et al. |
| 4,030,966 A | 6/1977 | Hornig et al. |
| 4,066,868 A | 1/1978 | Witkin et al. |
| 4,350,560 A | 9/1982 | Helgeland et al. |
| 5,098,673 A | 3/1992 | Engel et al. |
| (Continued) | | |

FOREIGN PATENT DOCUMENTS

| | | |
|---|---|---|
| CN | 101061570 A | 10/2007 |
| EP | 1908860 A1 | 4/2008 |
| (Continued) | | |

OTHER PUBLICATIONS

U.S. Appl. No. 13/656,615, filed Oct. 19, 2012.
(Continued)

*Primary Examiner* — Robert M Kunemund
(74) *Attorney, Agent, or Firm* — Patterson & Sheridan, LLP

(57) ABSTRACT

An apparatus for processing material at elevated pressure, the apparatus comprising: (a) two or more radial restraint structures defining an interior region configured to receive a processing chamber, the radial restraint structures being configured to resist an outward radial force from the interior region; (b) upper and lower crown members being disposed axially on either end of the interior region and configured to resist an outward axial force from the interior region; (c) a first axial restraint structure coupling the upper crown member and the lower crown member to provide axial restraint of the upper crown member and the lower crown; and (d) a second axial restraint structure compressing the two or more radial restraint structures to provide an axial restraint of the two or more radial restraint structures.

20 Claims, 4 Drawing Sheets

(56) References Cited

U.S. PATENT DOCUMENTS

| | | |
|---|---|---|
| 5,169,486 A | 12/1992 | Young et al. |
| 5,474,021 A | 12/1995 | Tsuno et al. |
| 6,129,900 A | 10/2000 | Satoh et al. |
| 6,273,948 B1 | 8/2001 | Porowski et al. |
| 6,398,867 B1 | 6/2002 | D'Evelyn et al. |
| 6,406,540 B1 | 6/2002 | Harris et al. |
| 6,528,427 B2 | 3/2003 | Chebi et al. |
| 6,533,874 B1 | 3/2003 | Vaudo et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 7,001,577 B2 | 2/2006 | Zimmerman et al. |
| 7,012,279 B2 | 3/2006 | Wierer, Jr. et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | E'Evelyn et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,316,746 B2 | 1/2008 | D'Evelyn et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Griddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 9,724,666 B1 * | 8/2017 | Rajeev .................. B01J 19/06 |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki et al. |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0124435 A1 | 7/2004 | D'Evelyn et al. |
| 2004/0161222 A1 | 8/2004 | Niida et al. |
| 2004/0245535 A1 | 12/2004 | D'Evelyn et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0205215 A1 | 9/2005 | Griddings et al. |
| 2005/0263791 A1 | 12/2005 | Yanagihara et al. |
| 2006/0021582 A1 | 2/2006 | Saito et al. |
| 2006/0032428 A1 | 2/2006 | Dwilinski et al. |
| 2006/0037529 A1 | 2/2006 | D'Evelyn et al. |
| 2006/0037530 A1 | 2/2006 | D'Evelyn et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0255341 A1 | 11/2006 | Pinnington et al. |
| 2006/0255343 A1 | 11/2006 | Ogihara et al. |
| 2006/0288927 A1 | 12/2006 | Chodelka et al. |
| 2007/0057337 A1 | 3/2007 | Kano et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa et al. |
| 2008/0006831 A1 | 1/2008 | Ng |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0298409 A1 | 5/2008 | Yamashita et al. |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |

(56) References Cited

U.S. PATENT DOCUMENTS

| | | |
|---|---|---|
| 2008/0211416 A1 | 9/2008 | Negley et al. |
| 2008/0230765 A1 | 9/2008 | Yoon et al. |
| 2008/0272462 A1 | 11/2008 | Shimamoto et al. |
| 2008/0282978 A1 | 11/2008 | Butcher et al. |
| 2008/0285609 A1 | 11/2008 | Ohta et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0216845 A1* | 8/2013 | Hashimoto ............... C30B 7/10 428/548 |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |
| 2015/0275391 A1* | 10/2015 | Hashimoto ............. C30B 7/105 117/224 |
| 2016/0010238 A1* | 1/2016 | Hashimoto ............... C30B 7/10 117/71 |

FOREIGN PATENT DOCUMENTS

| | | |
|---|---|---|
| JP | 2005-289797 A | 10/2005 |
| WO | 2004030061 A1 | 4/2004 |
| WO | 2006038467 A1 | 4/2006 |
| WO | 2006057463 A1 | 6/2006 |
| WO | 2007004495 A1 | 1/2007 |
| WO | 2010068916 A1 | 6/2010 |
| WO | 2012016033 A1 | 2/2012 |

OTHER PUBLICATIONS

Altoukhov et al., "High refelctivitiy airgap distributed Bragg reflectors realized by wet etching of AlInN sacrificial layers", Applied Physics Letters, vol. 95, 2009, pp. 191102-1-3.

Callahan et al., "Systhesis and Growth of Gallium Nitride by the Chemial Vapor Reaction Process (CVRP)", MRS Internet Journal Nitride Semiconductor Research, vol. 4, No. 10, 1999, pp. 1-6.

Choi et al., "2.5A microcavity InGaN Light-emitting diodes fabricated by a selective dry-etch thinning process", Applied Physics Letters 91, 2007, pp. 061120.

Copel et al., "Surfactants in Epitaxial Growth", Physical review Letters, Aug. 7, 1989, vol. 63, No. 6, p. 632-635.

D'Evelyn et al., "Bulk GaN Crystal Growth by the High-Pressure Ammonothermal Method," Journal of Crystal Growth, vol. 300, 2007, pp. 11-16.

Dorsaz et al., "Selective oxidation of AlInN Layers for current confinement III-nitride devices", Applied Physics Letters, vol. 87, 2005, pp. 072102.

Ehrentraut et al., "The ammonothermal crystal growth of gallium nitride-A technique on the up rise", Proceedings IEEE, 98(7), pp. 1316-1323.

Fang et al, "Deep centers in semi-insulating Fe-doped native GaN substrates grown by hydride vapour phase epitaxy", Physica Status Solidi (c), vol. 5, No. 6, 2008, pp. 1508-1511.

Fujito et al., "Development of Bulk GaN Crystals and Nonpolar/Smipolar Substrates by HVPE", MRS Bulletin, vol. 34, No. 5, May 2009, pp. 313-3173

Fukuda et at., "Prospects for the Ammonothermal Growth of Large GaN Crystal," Journal of Crystal Growth, vol. 305, 2007, pp. 304-310.

Gladkov et al., "Effect of Fe doping on optical properties of freestanding semi-insulating HVPE GaN: Fe", Journal of Crystal Grwoth, 312, 2010, pp. 1205-1209.

Grzegory, "High pressure growth of bulk GaN from Solutions in gallium", Journal of Physics Condensed Matter, vol. 13, 2001, pp. 6875-6892.

Tyagi et al., "Semipolar (1011) InGaN/GaN Laser Diodes on Bulk GaN Substrates," Japanese Journal of Applied Physics, vol. 46, No. 19, 2007, pp. L444-L445.

Iso et al., "High Brightness Blue InGaN/GaN Light Emitting Diode on Nonpolar m-Plane Bulk GaN Substrate," Japanese Journal of Applied Physics, vol. 46, No. 40, 2007, pp. L960-L962.

Wang et al., "Ammonothermal Growth of GaN Crystals in Alkaline Solutions", Journal of Crystal Growth, vol. 287, 2006, pp. 376-380.

Lu et al., "Structure of the Cl-passivated GaAs(111) surface", Physical Review B, vol. 58, No. 20, Nov. 15, 1998, pp. 13820-13823.

Massies et al., "Surfactant mediated epitaxial growth of InxGa1-xAs on GaAs(001)", Applied Physics Letters, vol. 61, No. 1, Jul. 6, 1992, pp. 99-101.

Moutanabbir, "Bulk GaN Ion Cleaving", Journal of Electronic Materials, vol. 39, No. 5, 2010, pp. 482-488.

Oshima et al., "Thermal and Optical Properties of Bulk GaN Crystals Fabricated Through Hydride Vapor Phase Epitaxy With Void-Assisted Separation", Journal of Applied Physics, vol. 98, No. 10, Nov. 18, 2005, pp. 103509-1-103509-4.

Pattison et al., "Gallium Nitride Based Microcavity Light Emitting Diodes With 2A Effective Cavity Thickness", Applied Physics Letters, vol. 90, Issue 3, 031111 (2007) 3 pg.

Porowski et al, "High Resistivity GaN Single Crystalline Substrates", Acta Physica Polonia A, vol. 92, No. 5, 1997, pp. 958-962.

Porowski, S. "Near Defect Free GaN Substrates", Journal of Nitride Semiconductor, 1999, pp. 1-11.

Roder et al., "Temperature dependence of the thermal expansion of GaN", Physcs Review B, vol. 72, 2005, pp. 085218,.

(56) References Cited

OTHER PUBLICATIONS

Weisbuch et al., "Recent results and latest views on microcavity LEDs", Light-Emitting Diodes: Research, Manufacturing, and Applications VIII, ed. By S.A. Stockman etal., Proc. SPIE, vol. 5366, p. 1-19 (2004).

Sharma et al., "Vertically oriented GaN-based air-gap distributed Bragg reflector structure fabricated using band-gap-selective photoelectrochemial etching", Applied Physics Letters, vol. 87, 2005, pp. 051107.

Sumiya et al., "High-pressure synthesis of high-purity diamond crystal", Diamond and Related Materials, 1996, vol. 5, pp. 1359-1365.

Tyagi et al., "Partial Strain relaxation via misfit dislocation generation at heterointerfaces in (Al,In) GaN epitaxial layers grown on semipolar (1122)GaN free standing substrates", Applied Physics Letters 95, (2009) pp. 251905.

\* cited by examiner

# APPARATUS FOR HIGH PRESSURE REACTION

FIELD OF DISCLOSURE

The present disclosure relates generally to techniques for an apparatus for processing supercritical fluids. More specifically, embodiments of the disclosure include techniques for configuring a material processing capsule disposed within a high-pressure apparatus enclosure.

BACKGROUND OF THE DISCLOSURE

Conventional crystal growth techniques involve processing supercritical fluids in a high-pressure apparatus. Such an apparatus is disclosed, for example, in D'Evelyn et al., U.S. Pat. No. 8,435,347 (incorporated herein by reference). FIG. 1 is a simplified diagram illustrating a high pressure apparatus 100 according to an embodiment of D'Evelyn et al. The apparatus comprises a stack of two or more radial restraint structures 100, comprising a high strength enclosure ring 101 and a ceramic ring 103. The stack surrounds heater 105, and the interior of heater 105 defines a processing chamber, into which capsule 107 may be placed. Thus, the heater is positioned between the capsule and one or more radial restraint structures. The stack provides radial confinement for pressure generated within capsule 107 and transmitted outward through heater 105. Axial confinement of pressure generated within capsule 107 may be provided by end plugs 111, crown members 117, and tie rods or tie rod fasteners 115. Apparatus 100 may also include a pressure transmission medium 109 proximate to the axial ends of capsule 107 and to end plugs 111 according to a specific embodiment.

Although this apparatus design represents a significant improvement over conventional apparatus configurations, Applicants have discovered that during high pressure reactions, the apparatus can distort. Specifically, Applicants have discovered that under very high pressure, the heater within the interior region defined by die stack may extrude into gaps between adjacent ring assemblies of the die stack, causing cracking of the corners of rings assemblies and making it more difficult to remove the heater from the ring assemblies for maintenance or replacement. The Applicants have further discovered that this undesirable extrusion and damage may be prevented by axially restraining the ring assemblies in the die stack.

Therefore, there is a need for an improved apparatus configuration that can withstand extremely high process pressures. The present invention fulfills this need among others.

BRIEF SUMMARY OF THE DISCLOSURE

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention relates generally to an improvement over the apparatus configuration disclosed by D'Evelyn et al. in U.S. Pat. No. 8,435,347. As mentioned above, Applicants have discovered that under very high pressure, the heater within the interior region defined by the die stack may extrude into gaps between adjacent ring assemblies of the die stack, causing cracking of the corners of rings assemblies and making it more difficult to remove the heater from the ring assemblies for maintenance or replacement. Applicants have further discovered that this undesirable extrusion and damage may be prevented by axially restraining the ring assemblies in the die stack. To this end, the apparatus of the claimed invention comprises an axial restraint structure for compressing the die stack to prevent gaps from forming due to pressure in the interior region during operation.

One aspect of the invention is an apparatus having an axial restraint structure to prevent the relative axial movement of the radial restraint members. In one embodiment, the apparatus comprises: (a) two or more radial restraint structures defining an interior region configured to receive a processing chamber, the radial restraint structures being configured to resist an outward radial force from the interior region; (b) upper and lower crown members being disposed axially on either end of the interior region and configured to resist an outward axial force from the interior region; (c) a first axial restraint structure coupling the upper crown member and the lower crown member to provide axial restraint of the upper crown member and the lower crown; and (d) a second axial restraint structure compressing the two or more radial restraint structures to provide an axial restraint of the two or more radial restraint structures.

Another aspect of the invention is a method using the apparatus described above to superheat solvent and produce a crystalline material.

The present disclosure achieves these benefits and others in the context of known process technology. However, a further understanding of the nature and advantages of the present disclosure may be realized by reference to the latter portions of the specification and attached drawings.

DETAILED DESCRIPTION OF THE DISCLOSURE

According to the present disclosure, techniques related to an apparatus for processing supercritical fluids are provided. More specifically, embodiments of the disclosure include techniques for configuring a material processing capsule disposed within a high-pressure apparatus enclosure. In a specific embodiment, the present disclosure provides an apparatus and methods to contain the reaction vessel in which gallium nitride crystals (henceforth referred to as bulk crystals) can be grown using the ammonothermal method at high pressure and temperature. The apparatus provides adequate containment in all directions which, for a typical cylindrical vessel, can be classified as radial and axial. Furthermore, depending on the specifics of the design parameters, the apparatus is capable of operating at a temperature up to 1200 degrees Celsius, a pressure up to 2000 MPa, and for whatever length of time is necessary to grow satisfactory bulk crystals, for example, between about 1 hour and about 180 days.

The design of the apparatus is scalable to contain reaction volumes larger than 100 cubic centimeters (cc) and has been successfully scaled up to contain a reaction volume larger than 13 liters. One skilled in the art may employ the concepts, principles, and analyses disclosed in this disclosure to design apparatus for the containment of even larger volumes, for example, larger than about 25 liters, larger than about 50 liters, larger than about 100 liters, larger than about 1000 liters, or larger than about 10,000 liters, and/or higher temperature and pressures. Further details of the apparatus can be found throughout the present specification and more particularly below.

Figure 1:
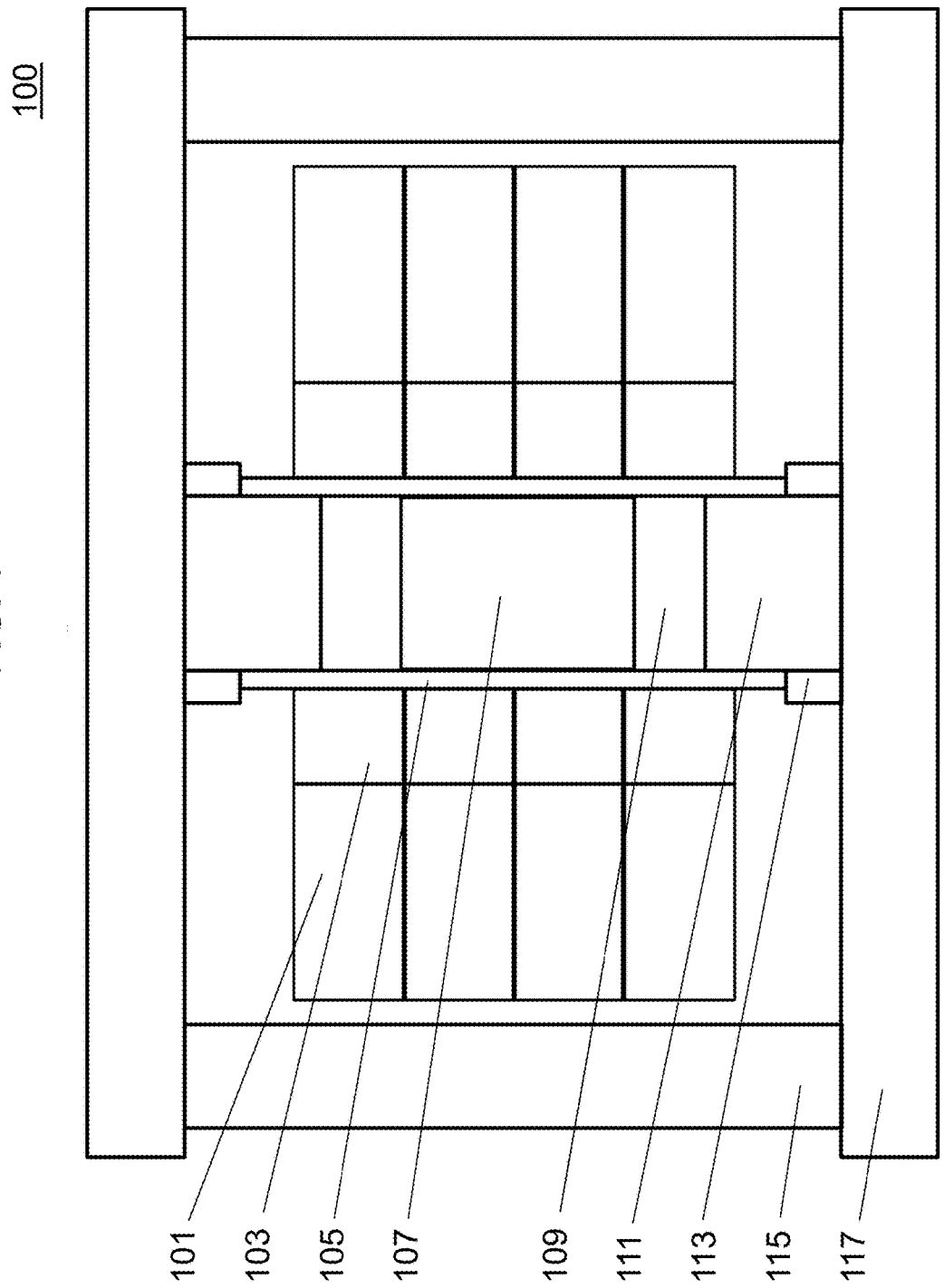
FIG. 1 is a simplified diagram illustrating a high pressure apparatus, according to an embodiment of the present disclosure.

Referring to FIGS. 2A and 2B, two embodiments of the apparatus 200, 250 of the present invention are shown. As shown, the apparatus 200, 250 is configured for processing material at elevated pressure and comprises two or more radial restraint structures 201 defining an interior region 270 configured to receive a processing chamber (not shown). The radial restraint structures are configured to resist an outward radial force from the interior region. The apparatus also comprises upper and lower crown members 202, 217 being disposed axially on either end of the interior region and configured to resist an outward axial force from the interior region. A first axial restraint structure 231 couples the upper crown member and the lower crown member to provide axial restraint of the upper crown member and the lower crown, and a second axial restraint structure 235 compresses the two or more radial restraint structures to provide an axial restraint of the two or more radial restraint structures. The upper and lower crown members 202, 217 and related upper and lower end plugs 251, 211, respectively are conventional and are described for example in connection with the apparatus in FIG. 1 above. In certain embodiments, upper and lower crown members 202, 217 may comprise flanges or a similar crown closure structures (not shown) that may be opened and closed and allow for access to the interior of the radial restraint structures without the need for removal of an entire crown member. Of particular interest in this disclose are the radial and axial restraint structures.

Figure 2:
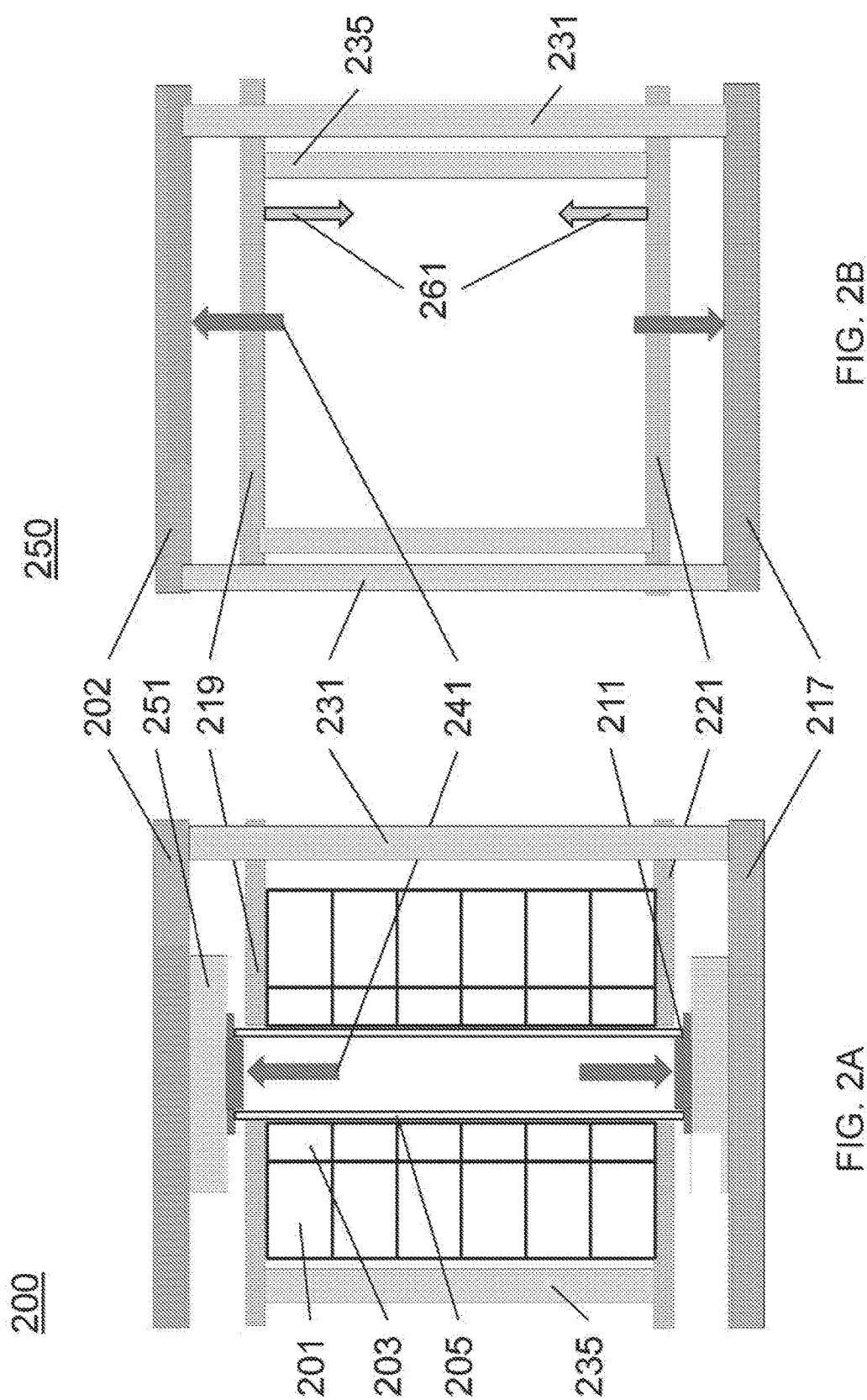
FIG. 2A is a simplified diagram illustrating a high pressure apparatus having axial restraint structures, according to embodiments of the present disclosure.
FIG. 2B is a simplified diagram illustrating a high pressure apparatus having axial restraint structures, according to embodiments of the present disclosure.

The radial constraint in the present apparatus may be provided by several stacked radial restraint structures 201. In one embodiment, the radial restraint structures comprise at least one annular ceramic member 203, which may be a unitary structure, or, alternatively, a combination of radial wedge segments. In one embodiment, one or more high strength enclosure rings encircle the ceramic member 203. In one embodiment, the radial restraint structures 201 are contained by upper and lower die restraint members 219, 221 as shown in FIG. 2. Alternatively, the die restraint members can be part of the set of radial restraint structures. These stacked ring assemblies will henceforth be collectively referred to as the die stack.

The apparatus further includes a first axial restraint structure 231 that provides structural resistance or stiffness to the relative displacement between the upper crown member and the lower crown member. The apparatus also includes a second axial restraint structure 235 that provides structural resistance or stiffness to the relative axial displacement of the radial restraint members 201. In one embodiment, the second axial restraint structure couples the radial restraint members together to prevent their relative axial movement. Different configurations can be used to effect this coupling. For example, in the embodiment of FIG. 2, in which upper and lower die restraint members 219, 221 are used, the second axial restraint structure is connected to the upper die restraint member and the lower die restraint member.

During operation, internal pressure within the die stack, for example, due to pressure within a capsule (not shown), generates an axial load 241 that places an outward-oriented force on crown members 202 and 217. As mentioned above, in the absence of axial restraint of the die stack, a larger thermal expansion of the heater (not shown) relative to the ring assemblies, together with limited outward motion of the crown members, coupled with friction between a heater and the die stack, may cause separation between adjacent ring assemblies and extrusion of the outer diameter of the heater into the nascent gaps and cracking of the corners of ceramic rings 203. In certain embodiments, an axial force 261 counteracts the tendency for and prevents separation between adjacent ring assemblies, maintains intimate contact between ring assemblies, and prevents extrusion of the outer diameter of the heater under operating conditions. In certain embodiments, axial force 261 is generated by thermal expansion of the inner diameters of ceramic rings 203. In certain embodiments, at least a portion of axial force 261 is generated by pre-loading one or more tie rods or axial restraint members coupled between the upper die restraint member and the lower die restraint member. In certain embodiments, axial force 261 corresponds to a pressure, calculated over an interior cross-sectional area of the two or more radial restraint structures or ring assemblies, between about 20 MPa and about 2000 MPa, between about 30 MPa and about 500 MPa, or between about 40 MPa and about 200 MPa under operating conditions.

Figure 3:
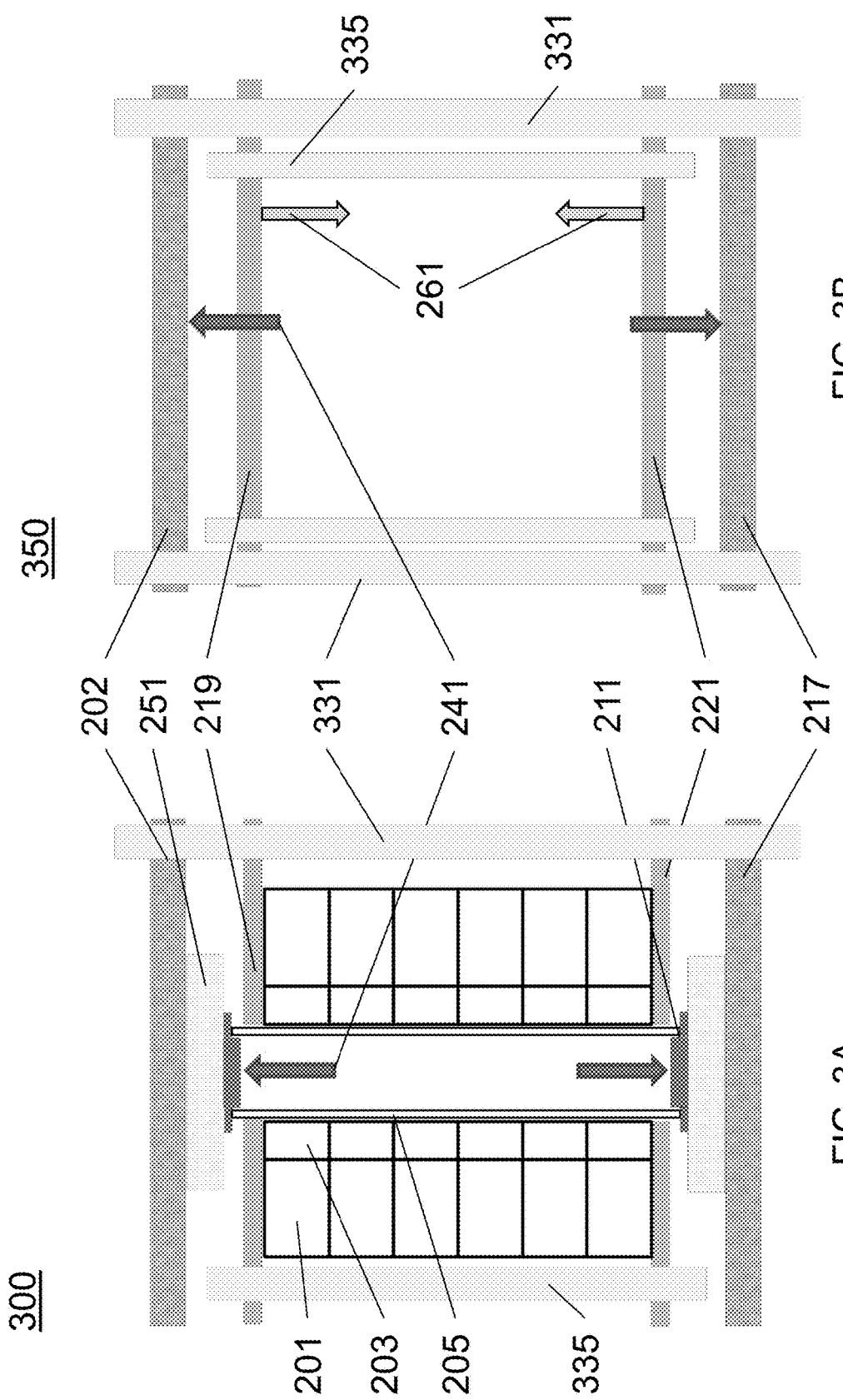
FIG. 3A is a simplified diagram illustrating a high pressure apparatus having axial restraint structures, according to embodiments of the present disclosure.
FIG. 3B is a simplified diagram illustrating a high pressure apparatus having axial restraint structures, according to embodiments of the present disclosure.

The first and second axial restraint structures can be formed by means of tie rods (as shown in FIG. 2), yokes 331, 335 (as shown in FIGS. 3A and 3B) or other structural techniques that would be available to those skilled in the art. The axial restraint function can be realized by pre-tensioning the axial restraint structure, re-directing the forces generated due to the process pressure, by taking advantage of the relative temperature difference between the radial restraint structures and the axial restraint structures, or a combination thereof In certain embodiments, each set of first tie rods 231 and second tie rods 235 is symmetrically placed about the axis of the apparatus, so that axial mechanical loads are shared approximately equally between the tie rods comprising each set. In certain embodiments, at least one of the set of first tie rods 231 and the set of second tie rods 235 comprises a set of two tie rods, a set of three tie rods, a set of four tie rods, a set of five tie rods, or a set of six tie rods.

Tie rod fasteners 115 may comprise a material, for example, selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel®, Inconel®, Hastelloy®, Udimet® 500, Stellite®, Rene® 41, and Rene® 88

Referring to FIG. 3A and FIG. 3B, in certain alternative embodiments 300 and 350, axial restraint of the die stack is provided by one or more first yoke members 335 rather than a set of tie rods. In certain alternative embodiments, axial restraint of the crown members is provided by one or more second yoke members 331. In certain embodiments, at least one of first yoke members 335 and second yoke members 331 comprise structures having a rectangular inside opening. In certain embodiments, at least one of first yoke members 335 and second yoke members 331 comprise tensioned steel wire. Other axial restraint structures are also possible.

In certain embodiments, closeable openings or crown inserts are provided in the crown members or crown plates to allow for insertion and removal of capsules, heaters, and other components while retaining capability for supporting large axial loads.

A method of use according to a specific embodiment is briefly outlined below.

Provide an apparatus for high pressure crystal growth or material processing, such as the ones described above, but there can be others, the apparatus comprising an interior or capsule region (for example, cylindrical in shape) surrounded by radial restraint structures and supported axially by tie rods coupled between crown plate and die restraint members, the opening regions to the interior region through the crown plate members being closable by crown closure structures;

Provide a processing chamber or capsule containing a solvent;

Place the processing chamber within the interior region and close the crown closure structures;

Process the processing chamber with thermal energy to cause an increase in temperature within the processing chamber to greater than 200 degrees Celsius to cause the solvent to be superheated;

Form a crystalline material from a process of the superheated solvent;

Remove thermal energy from the processing chamber to cause a temperature of the capsule to change from a first temperature to a second temperature, which is lower than the first temperature;

Open an opening region to the interior region of the high pressure apparatus by removing a crown closure structure;

Remove the processing chamber from the capsule region;

Open the processing chamber;

Remove the crystalline material; and

Perform other steps, as desired.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein. Details of the present method and structure can be found throughout the present specification and more particularly below.

Figure 4:
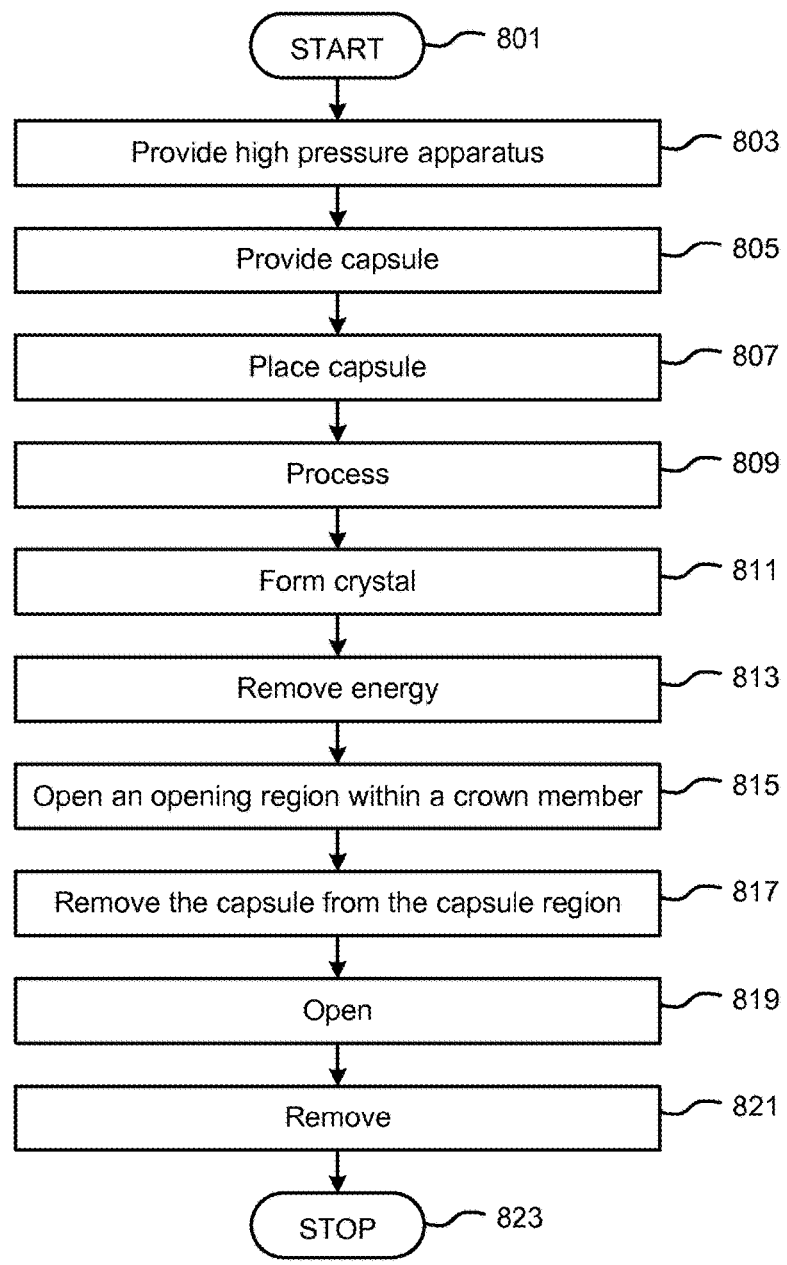
FIG. 4 is a simplified flow diagram of a method of processing a material within a supercritical fluid, according to an embodiment of the present disclosure.

FIG. 4 is a simplified flow diagram 800 of a method of processing a material within a supercritical fluid. This diagram is merely an example, which should not unduly limit the scope of the claims herein.

In a specific embodiment, the method begins with start, step 801. The method begins by providing an apparatus for high pressure crystal or material processing (see step 803), such as the one described above, but there can be others. In certain embodiments, the apparatus has an interior or capsule region (for example, cylindrical in shape) surrounded by radial restraint structures and supported axially by tie rods coupled between crown plate and die restraint members. In certain embodiments, the opening regions to the capsule region through crown plate members are closable by crown closure structures.

In a specific embodiment, the method provides a capsule or processing chamber containing a solvent, such as ammonia (see step 805), for example. In a specific embodiment, the method places the capsule (see step 807) containing the solvent and starting seed crystals and polycrystalline nutrient material within an interior region of the capsule region. The method processes the capsule (see step 809) with thermal energy to cause an increase in temperature within the capsule to greater than 200 Degrees Celsius to cause the solvent to be superheated.

Referring again to FIG. 4, the method forms a crystalline material (see step 811) from a process of the superheated solvent. In certain embodiments, the crystalline material comprises a gallium-containing nitride crystal such as GaN, AlGaN, InGaN, and others. In a specific embodiment, the method removes thermal energy from the capsule (see step 813) to cause a temperature of the capsule to change from a first temperature to a second temperature, which is lower than the first temperature. Once the energy has been removed and temperature reduced to a suitable level, the method opens an opening region within a crown member (step 815), which mechanically held at least the capsule in place. In certain embodiments, the method removes the capsule from the capsule region (see step 817), free from the apparatus.

In a specific embodiment, the capsule is now free from the apparatus. In a specific embodiment, the capsule is opened, step 819. In a certain embodiment, the crystalline material is removed from an interior region of the capsule, step 821. Depending upon the embodiment, there can also be other steps, which can be inserted or added or certain steps can also be removed. In a specific embodiment, the method ends at stop, step 823.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

In certain embodiments, a gallium-containing nitride crystal or boule grown by methods such as those described above is sliced or sectioned to form wafers. The slicing, sectioning, or sawing may be performed by methods that are known in the art, such as internal diameter sawing, outer diameter sawing, fixed abrasive multiwire sawing, fixed abrasive multiblade sawing, multiblade slurry sawing, multiwire slurry sawing, ion implantation and layer separation, or the like. The wafers may be lapped, polished, and chemical-mechanically polished according to methods that are known in the art.

One or more active layers may be deposited on the well-crystallized gallium-containing nitride wafer. The active layer may be incorporated into an optoelectronic or electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

While the above is a full description of the specific embodiments, various modifications and alternative constructions and equivalents may be used. Therefore, the above description and illustrations should not be taken as limiting the scope of the present disclosure which is defined by the appended claims.

What is claimed is:

1. An apparatus for processing material at elevated pressure, the apparatus comprising:
    two or more radial restraint structures defining an interior region configured to receive a processing chamber, said radial restraint structures being configured to resist an outward radial force from said interior region;
    upper and lower crown members being disposed axially on either end of said interior region and configured to resist an outward axial force from said interior region;
    a first axial restraint structure coupling said upper crown member and said lower crown member to provide axial restraint of said upper crown member and said lower crown member; and
    a second axial restraint structure compressing said two or more radial restraint structures to provide an axial restraint of said two or more radial restraint structures.

2. The apparatus of claim 1, wherein said first axial restraint structure comprises at least two tie rods.

3. The apparatus of claim 1, wherein said second axial restraint structure comprises at least two tie rods.

4. The apparatus of claim 1, wherein at least one of said first axial restraint structure or said second axial restraint structure comprises a yoke member.

5. The apparatus of claim 1, further comprising a heater disposed within said interior region.

6. The apparatus of claim 5, further comprising a processing chamber disposed within said heater.

7. The apparatus of claim 1, wherein at least one of said one or more radial restraint structures comprises a ring assembly comprising a high strength enclosure ring and a ceramic ring.

8. The apparatus of claim 7, wherein said ceramic ring comprises a ceramic radial segment assembly.

9. The apparatus of claim 1, wherein the second axial restraint structure is configured to provide a pressure between about 20 MPa and about 2000 MPa under operation over an interior cross-sectional area of the one or more radial restraint structures.

10. The apparatus of claim 1, wherein said two or more radial restraint structures comprise upper and lower die restraint members and at least one radial restraint structure sandwiched between said upper and lower die restraint members.

11. An apparatus for processing material at elevated pressure, the apparatus comprising:
    an upper crown member;
    a lower crown member;
    an upper die restraint member;
    a lower die restraint member;
    one or more radial restraint structures disposed between the upper die restraint member and the lower die restraint member, said radial restraint structures defining an interior region configured to receive a processing chamber, said radial restraint structures being configured to resist an outward radial force from said interior region, said upper and lower crown members being disposed axially on either end of said interior region and configured to resist an outward axial force from said interior region;
    a first axial restraint structure coupling the upper crown member and the lower crown member; and
    a second axial restraint structure coupling the upper die restraint member and the lower die restraint member, wherein the second axial restraint structure is configured to provide an axial restraint of the one or more radial restraint structures.

12. The apparatus of claim 11, wherein said first axial restraint structure comprises at least two tie rods.

13. The apparatus of claim 11, wherein said second axial restraint structure comprises at least two tie rods.

14. The apparatus of claim 11, wherein at least one of said first axial restraint structure or said second axial restraint structure comprises a yoke member.

15. The apparatus of claim 11, further comprising a heater disposed within said interior region.

16. The apparatus of claim 15, further comprising a processing chamber disposed within said heater.

17. The apparatus of claim 11, wherein at least one of said one or more radial restraint structures comprises a ring assembly comprising a high strength enclosure ring and a ceramic ring.

18. The apparatus of claim 17, wherein said ceramic ring comprises a ceramic radial segment assembly.

19. The apparatus of claim 11, wherein the second axial restraint structure is configured to provide a pressure between about 20 MPa and about 2000 MPa under operation over an interior cross-sectional area of the one or more radial restraint structures.

20. A method for crystal growth using an apparatus comprising:
    two or more radial restraint structures defining an interior region configured to receive a processing chamber, said radial restraint structures being configured to resist an outward radial force from said interior region;
    upper and lower crown members being disposed axially on either end of said interior region and configured to resist an outward axial force from said interior region;
    a first axial restraint structure coupling said upper crown member and said lower crown member to provide axial restraint of said upper crown member and said lower crown member; and
    a second axial restraint structure compressing said two or more radial restraint structures to provide an axial restraint of said two or more radial restraint structures;
said method comprising:
    placing said processing chamber containing solvent, seed crystals, and polycrystalline nutrient material into said interior region; and
    heating said processing chamber to a temperature greater than 200 degrees Celsius to cause the solvent to become superheated and form a crystalline material.

* * * * *